(12) United States Patent
Lee et al.

(10) Patent No.: US 10,139,662 B2
(45) Date of Patent: Nov. 27, 2018

(54) DISPLAY DEVICE HAVING A PROTECTION MEMBER

(71) Applicant: SAMSUNG DISPLAY CO., LTD., Yongin-si, Gyeonggi-do (KR)

(72) Inventors: Yongjun Lee, Hwaseong-si (KR); Jungki Kim, Hwaseong-si (KR); Youngrok Oh, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/821,248

(22) Filed: Nov. 22, 2017

(65) Prior Publication Data

US 2018/0157091 A1    Jun. 7, 2018

(30) Foreign Application Priority Data

Dec. 5, 2016  (KR) .................. 10-2016-0164527

(51) Int. Cl.
*G02F 1/1333* (2006.01)
*H05K 1/14* (2006.01)

(52) U.S. Cl.
CPC ....... *G02F 1/133308* (2013.01); *H05K 1/148* (2013.01); *G02F 2001/133314* (2013.01); *G02F 2201/50* (2013.01); *H05K 2201/056* (2013.01); *H05K 2201/10136* (2013.01)

(58) Field of Classification Search
CPC ... G02F 1/133308; G02F 2001/133314; G02F 2201/50; H05K 1/148; H05K 2201/10136; H05K 2201/056
USPC ......................................................... 349/58
See application file for complete search history.

(56) References Cited

U.S. PATENT DOCUMENTS

| | | | |
|---|---|---|---|
| 8,624,940 B2 | 1/2014 | Kim et al. | |
| 9,599,856 B2 | 3/2017 | Lee et al. | |
| 2008/0018822 A1 | 1/2008 | Yamamoto | |
| 2009/0040450 A1* | 2/2009 | Nakaminami | G02F 1/13452 349/152 |
| 2009/0103316 A1* | 4/2009 | Aoki | G02F 1/133608 362/362 |
| 2010/0014025 A1* | 1/2010 | Teragawa | G02F 1/133606 349/64 |
| 2011/0255015 A1* | 10/2011 | Kasai | G02F 1/133608 348/739 |

(Continued)

FOREIGN PATENT DOCUMENTS

KR   10-2008-0075341   8/2008
KR   10-1087231       11/2011

(Continued)

OTHER PUBLICATIONS

European Search Report dated Apr. 3, 2018 in corresponding European Patent Application 17205407.4 (7 pages).

*Primary Examiner* — Sherman Ng
(74) *Attorney, Agent, or Firm* — F. Chau & Associates, LLC

(57) ABSTRACT

A display device includes a display panel. A bottom chassis is dimensioned and positioned to support the display panel. A driving circuit board is positioned below a back surface of the bottom chassis facing away from the display panel. A protection member is positioned on the driving circuit board. A guide member is coupled to the bottom chassis and fastens the driving circuit board and the protection member to each other.

23 Claims, 10 Drawing Sheets

(56) References Cited

U.S. PATENT DOCUMENTS

| | | | |
|---|---|---|---|
| 2014/0043848 A1* | 2/2014 | Jung | G02B 6/0055 |
| | | | 362/606 |
| 2014/0169033 A1* | 6/2014 | Yu | H05K 7/20409 |
| | | | 362/611 |
| 2015/0331178 A1* | 11/2015 | Choi | G02B 6/0083 |
| | | | 362/611 |
| 2016/0282662 A1 | 9/2016 | Cai et al. | |
| 2016/0320648 A1 | 11/2016 | Lee | |
| 2017/0006726 A1 | 1/2017 | Li et al. | |

FOREIGN PATENT DOCUMENTS

| | | |
|---|---|---|
| KR | 10-2016-0006285 | 1/2016 |
| KR | 10-2016-0015480 | 2/2016 |
| KR | 10-1594855 | 2/2016 |
| WO | 20160138799 | 9/2016 |

\* cited by examiner

DISPLAY DEVICE HAVING A PROTECTION MEMBER

CROSS-REFERENCE TO RELATED APPLICATION

This application claims priority under 35 U.S.C. § 119 to Korean Patent Application No. 10-2016-0164527, filed on Dec. 5, 2016, in the Korean Intellectual Property Office (KIPO), the disclosure of which is incorporated by reference herein in its entirety.

1. TECHNICAL FIELD

Exemplary embodiments of the present invention relate to a display device, and more particularly, to a display device including a protection member.

2. DISCUSSION OF RELATED ART

Liquid crystal display ("LCD") devices are one of most widely used types of flat panel display ("FPD") devices. An LCD device may include two substrates including electrodes formed thereon and a liquid crystal layer positioned therebetween. Upon applying voltage to the two electrodes, liquid crystal molecules of the liquid crystal layer may be rearranged such that an amount of transmitted light is controlled in the LCD device.

The LCD device may include an LCD panel and a backlight unit (BLU) supplying light to the LCD panel. The backlight unit may be a direct type, an edge type or a corner type.

The edge type backlight unit may include a light guide plate and a light source disposed on one side of the light guide plate, and the light emitted from the light source may be radiated to the LCD panel through the light guide plate. The direct-type backlight unit includes a plurality of light sources below the LCD panel, and thus luminance may be increased and a light emitting surface may be relatively wide.

A printed circuit board (PCB) driving the LCD panel may be connected to at least one side of the LCD panel through a chip on film (COF) or a tape carrier package (TCP). The COF or TCP may include circuit wirings formed in a thin and bendable plate-like material, allowing an electrical signal of a driving circuit board to be applied to the LCD panel.

Generally, the PCB is disposed in close contact with a back surface of a bottom chassis to reduce the volume during a modularization process, and thus the COF or TCP connecting the LCD panel and the PCB may be bent to a side surface of the bottom chassis.

A protection member protecting the driving circuit board, the COF, or the like may be disposed on the back surface of the bottom chassis. The protection member may be coupled to the bottom chassis using a screw or the like, and in such a case, due to a flatness difference of the bottom chassis, a gap between the driving circuit board and the protection member might not be constant and rattle noise due to screw tightening may occur.

SUMMARY

Exemplary embodiments of the present invention may be directed to a liquid crystal display ("LCD") device capable of fastening a driving circuit board and a protection member without any additional apparatus.

According to an exemplary embodiment of the present invention, a display device includes a display panel. A bottom chassis is dimensioned and positioned to support the display panel. A driving circuit board is positioned below a back surface of the bottom chassis facing away from the display panel. A protection member is positioned on the driving circuit board. A guide member is coupled to the bottom chassis and fastens the driving circuit board and the protection member to each other.

The guide member may include a support portion. A coupling portion may extend from a surface of the support portion facing the bottom chassis through the back surface of the bottom chassis opposite the display panel and may fasten the support portion to the bottom chassis. A first fastening portion extends from the support portion and fastens the driving circuit board to the guide member. A second fastening portion extends from the first fastening portion and fastens the protection member to the guide member.

The guide member may include a gap maintaining portion positioned between the first fastening portion and the second fastening portion.

The coupling portion may include at least one latch disposed on an inner surface of the bottom chassis facing the display panel.

The coupling portion may include an insert body projecting through the back surface of the bottom chassis opposite the display panel, and a latch extending from the insert body. The latch may be disposed on an inner surface of the bottom chassis facing the display panel.

The bottom chassis may have a first insertion hole. The coupling portion may project through the first insertion hole.

The first fastening portion may have a narrower width than a width of the second fastening portion.

The first fastening portion may have substantially a same width as a width of the second fastening portion.

The first fastening portion may have a wider width than a width of the second fastening portion.

A distance between the driving circuit board and the protection member may be in a range of from about 3 mm to about 7 mm.

The display device may include an insulating member disposed on a surface of the protection member facing the driving circuit board.

The display device may include at least one flexible printed circuit board connecting the display panel and the driving circuit board.

The protection member may have substantially a same shape as a shape of the driving circuit board and the flexible printed circuit board.

The protection member may include a projection protruding toward the bottom chassis.

The bottom chassis may have a second insertion hole. The projection may project through the second insertion hole.

The display device may include a top chassis covering an edge portion and a side surface of the display panel.

The protection member may include a hook coupled to the top chassis.

The top chassis may include a fastening hole. The hook may be disposed in the fastening hole.

The guide member may be integrally formed through injection molding.

The guide member may include at least one selected from polycarbonate (PC), a transparent acrylic resin, polystyrene (PS), polymethyl methacrylate (PMMA), or polyethylene terephthalate (PET).

According to an exemplary embodiment of the present invention, a display device includes a bottom chassis and a display panel positioned in the bottom chassis. A guide member is coupled to the bottom chassis. The guide member includes a coupling portion projecting through a hole formed in the bottom chassis. A support portion is in direct contact with a bottom surface of the bottom chassis facing away from the display panel. A driving circuit board is in direct contact with a surface of the support portion facing away from the bottom surface of the bottom chassis. A gap maintaining portion has a width wider than a width of the support portion. A protection member is disposed on the gap maintaining portion. The gap maintaining portion is positioned and dimensioned to separate the protection member from the driving circuit board along a direction orthogonal to the bottom surface of the bottom chassis.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
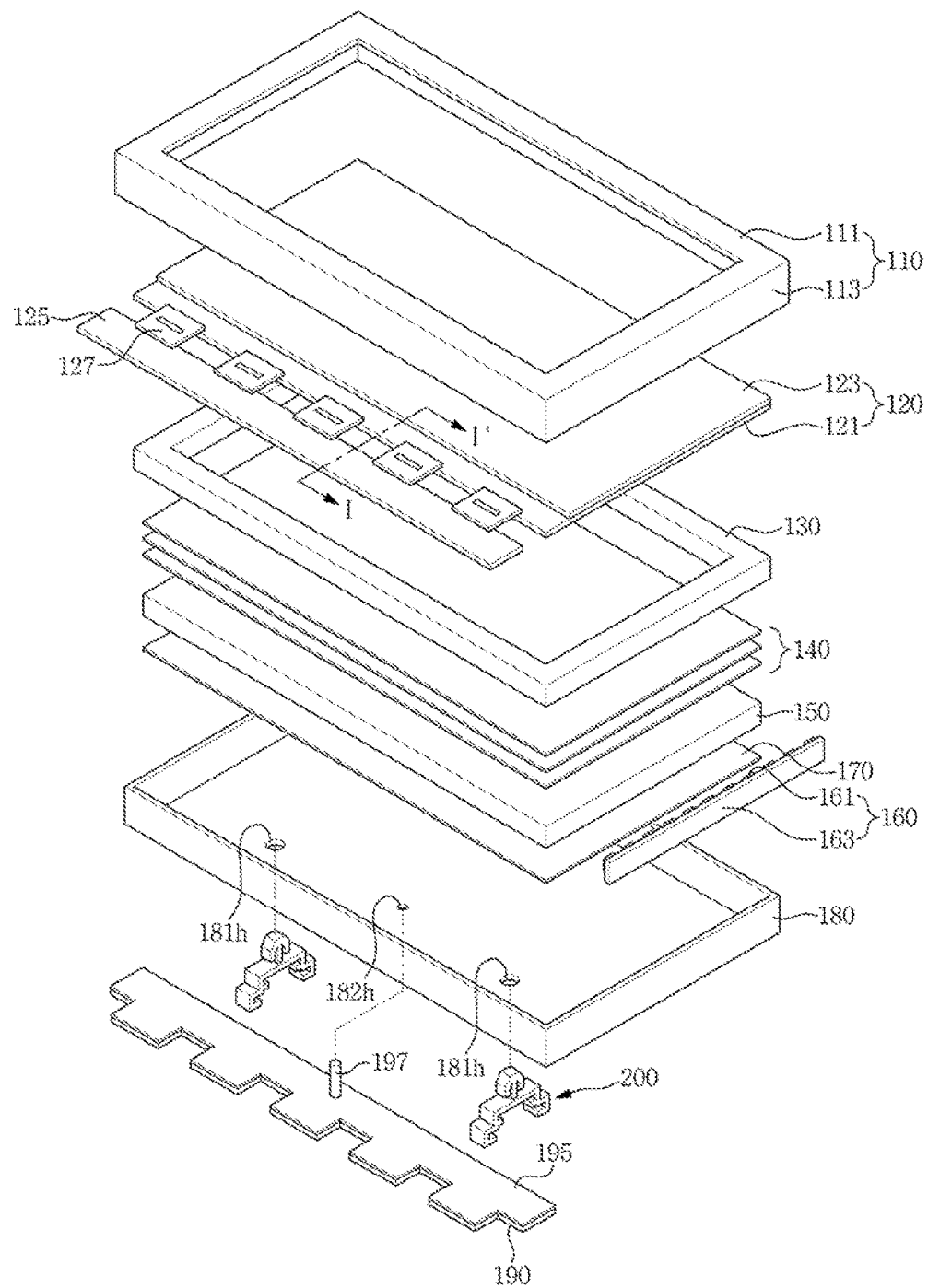
FIG. 1 is an exploded perspective view illustrating a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings Sizes of elements in the drawings may be exaggerated for clarity of description. It will be understood that when a component, such as a layer, a film, a region, or a plate, is referred to as being "on" another component, the component may be directly on the other component or intervening components may be present.

It will be understood that although the terms "first" and "second" may be used herein to describe various components, these components should not be limited by these terms.

Figure 2:
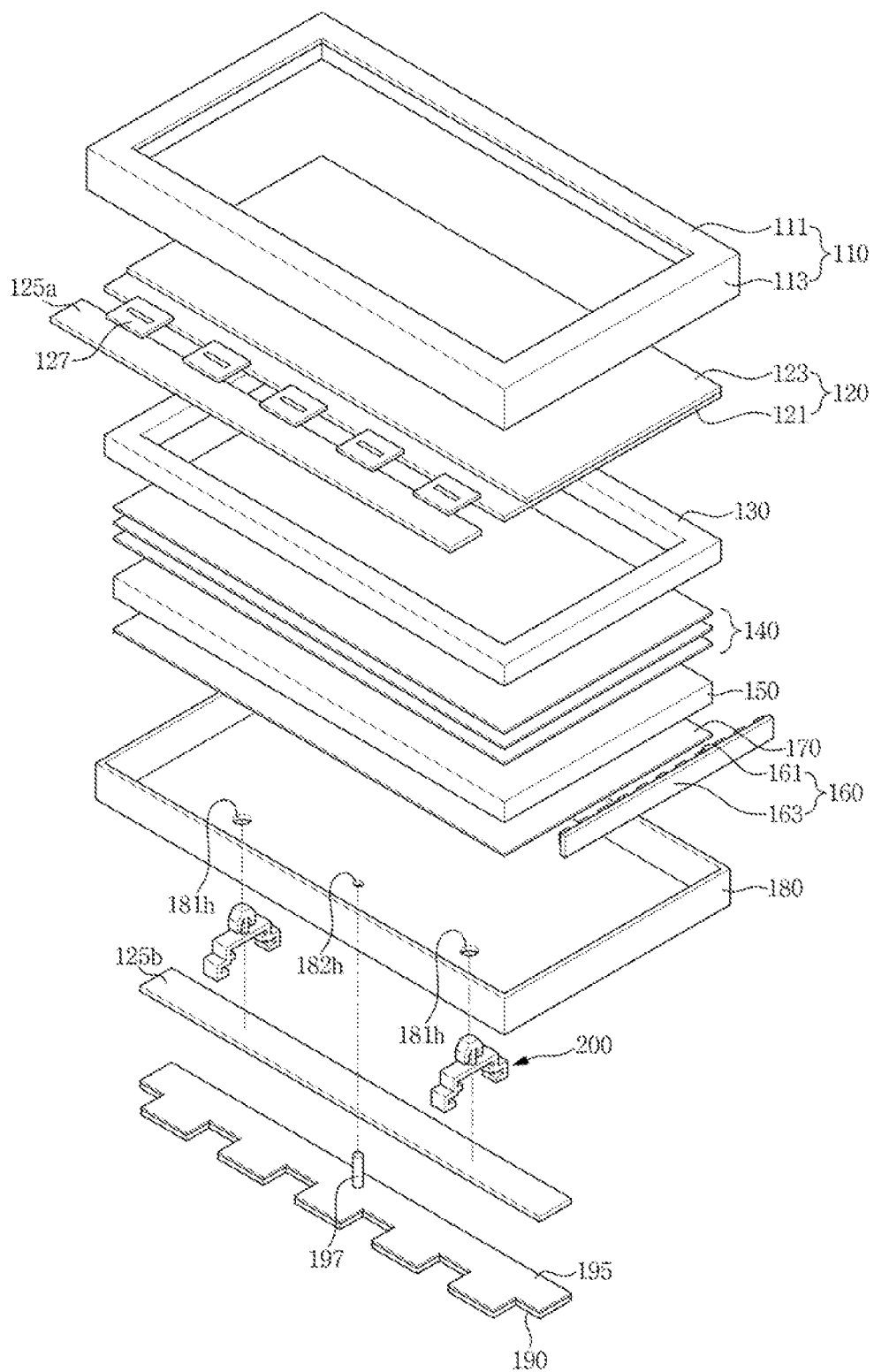
FIG. 2 is an exploded perspective view illustrating a display device according to an exemplary embodiment of the present invention.
Figure 3:
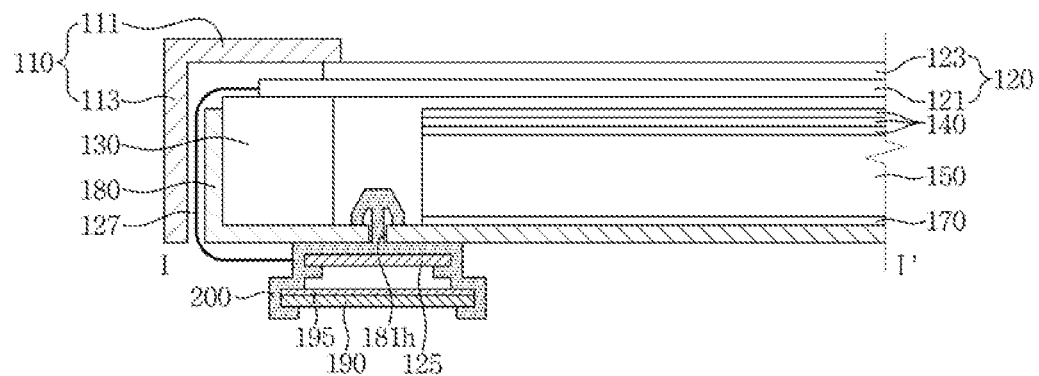
FIG. 3 is a cross-sectional view taken along line I-I' of FIG. 1.

FIG. 1 is an exploded perspective view illustrating a display device according to an exemplary embodiment of the present invention. FIG. 2 is an exploded perspective view illustrating a display device according to an exemplary embodiment of the present invention. FIG. 3 is a cross-sectional view taken along line I-I' of FIG. 1.

Referring to FIGS. 1, 2 and 3, the display device according to an exemplary embodiment of the present invention may include a top chassis 110, a display panel 120, a mold frame 130, an optical sheet 140, a light guide plate 150, a light source unit 160, a reflection sheet 170, a bottom chassis 180, and a protection member 190. The display device according to an exemplary embodiment of the present invention may include a guide member 200 coupled to the bottom chassis 180 and fastening a driving circuit board 125 and the protection member 190 to each other below the bottom chassis 180.

The mold frame 130, the optical sheet 140, the light guide plate 150, the light source unit 160, the reflection sheet 170 and the bottom chassis 180 may be collectively referred to herein as a backlight unit.

The display device according to an exemplary embodiment of the present invention may be an edge type display device in which the light source unit 160 is disposed on a side surface of the display panel 120. However, exemplary embodiments of the present invention are not limited thereto, and the display device according to an exemplary embodiment of the present invention may be a direct type display device in which the light source unit 160 is disposed on a back surface of the display panel 120.

The top chassis 110 may include a flat surface portion 111 that covers an edge of the display panel 120 and a side surface portion 113 that is bent at the flat surface portion 111 and covers a side surface of the display panel 120. The side surface portion 113 of the top chassis 110 may be coupled to the mold frame 130 or the bottom chassis 180 through hook coupling and/or screw coupling.

The display panel 120 may have a quadrangular plate shape (e.g., a rectangular shape). The display panel 120 may display an image using light. The display panel 120 may include various display panels such as an organic light emitting diode ("OLED") display panel, a liquid crystal display ("LCD") panel or an electrophoretic display panel. According to an exemplary embodiment of the present invention, the display panel 120 is an LCD panel.

The display panel 120 may include a first substrate 121, a second substrate 123 opposite the first substrate 121 and a liquid crystal layer between the first substrate 121 and the second substrate 123.

The first substrate 121 may include a plurality of pixel electrodes arranged in a matrix, a thin film transistor applying a driving voltage to each of the pixel electrodes, and various signal lines driving the pixel electrodes and the thin film transistor.

The second substrate 123 may be positioned opposite the first substrate 121, and may include a common electrode including a transparent conductive material, and a color filter. The color filter may include a red color filter, a green color filter or a blue color filter.

The liquid crystal layer may be disposed between the first substrate 121 and the second substrate 123, and may be rearranged by an electric field formed between the pixel electrode and the common electrode. Such a rearranged liquid crystal layer may adjust the transmittance of light emitted from the backlight unit, and the adjusted light may pass through the color filter to display an image to the outside.

A polarizer may be disposed on each of a back surface of the first substrate 121 and an upper surface of the second substrate 123 facing a direction opposite the back surface of the first substrate 121. The polarizer may occupy an area corresponding to that of the display panel. The polarizer may transmit only a predetermined polarized light among the light output from the backlight unit, or transmit only a predetermined polarized light among the light incident from the outside, and absorb or block the other light.

The driving circuit board 125 may be disposed on at least one side of the display panel 120. The driving circuit board 125 may apply a driving signal to various signal lines on the first substrate 121. The driving circuit board 125 may include a gate driving circuit board applying a scan signal and a data driving circuit board applying a data signal. Referring to FIG. 1, the driving circuit board 125 may be disposed on only one side of the display panel 120, but exemplary embodiments of the present invention are not limited thereto.

The display panel 120 and the driving circuit board 125 may be electrically connected to each other by at least one flexible printed circuit board 127. However, exemplary embodiments of the present invention are not limited thereto. For example, referring to FIG. 2, the driving circuit board 125 may include a first driving circuit board 125a connected to the flexible printed circuit board 127 and a second driving circuit board 125b separately provided from the flexible printed circuit board 127. For example, the first driving circuit board 125a may be a source printed circuit board ("PCB"), and the second driving circuit board 125b may be a control PCB.

Referring to FIG. 1 again, an end portion of the flexible printed circuit board 127 overlaps and is electrically connected to a portion of the first substrate 121, and another end portion of the flexible printed circuit board 127 overlaps and is electrically connected to a portion of the driving circuit board 125. The flexible printed circuit board 127 may be, for example, a chip on film (COF) or a tape carrier package (TCP). The flexible printed circuit board 127 described in more detail below may be a COF; however, exemplary embodiments of the present invention are not limited thereto. As an example, five flexible printed circuit boards 127 may be provided (see, e.g., FIGS. 1 and 2), but exemplary embodiments of the present invention are not limited thereto. The number of the flexible printed circuit boards 127 may vary depending on the size, or the driving scheme, for example, of the display panel 120.

A driving chip may be mounted on the flexible printed circuit board 127. The driving chip may generate various driving signals for driving the display panel 120. The driving chip may be a driving integrated circuit (IC) or a source IC, in which a timing controller and a data driving circuit are integrated into one chip. However, exemplary embodiments of the present invention are not limited thereto, and a driving chip may be disposed directly on the first substrate 121.

The plurality of flexible printed circuit boards 127 attached to a side of the display panel 120 may be bent along side surfaces of the mold frame 130 and the bottom chassis 180, and the driving circuit board 125 may be disposed on an edge portion of a back surface of the bottom chassis 180. The bottom chassis will be described in more detail below.

The mold frame 130, which may have a rectangular shape, may accommodate and support the display panel 120 and the optical sheet 140.

The optical sheet 140 may be disposed between the light guide plate 150 and the display panel 120. The optical sheet 140 may diffuse or collimate light transmitted from the light guide plate 150. The optical sheet 140 may include a diffusion sheet, a prism sheet and a protective sheet. The optical sheet 140 may include three optical sheets (see, e.g., FIG. 1); however, exemplary embodiments of the present invention are not limited thereto, and the optical sheet 140 may include two or more than four optical sheets, for example.

The diffusion sheet may disperse the light incident from the light guide plate 150 to prevent the light from being partially concentrated.

The prism sheet may include prisms, having a triangular cross-section, on a surface thereof in a predetermined arrangement. The prism sheet may be disposed on the diffusion sheet to collimate the light diffused from the diffusion sheet in a direction perpendicular to the display panel 120.

The protective sheet may be formed on the prism sheet, and may protect a surface of the prism sheet and may diffuse light, thus making the distribution of light uniform.

The light guide plate 150 may uniformly supply light provided from the light source unit 160 to the display panel 120. The light guide plate 150 may be formed in a quadrangular plate shape (e.g., a rectangular shape), but exemplary embodiments of the present invention are not limited thereto. When a light source such as an LED chip is used, the light guide plate 150 may be formed in various shapes including a predetermined groove or protrusion.

While the light guide plate 150 may have a quadrangular plate shape, the light guide plate 150 may be formed in the form of a sheet or a film for slimming down the display device. For example, the light guide plate 150 may include both a plate and a film for guiding light.

The light guide plate 150 may include a material having light transmittance, e.g., an acrylic resin such as polymethylmethacrylate (PMMA) or a material such as polycarbonate, to efficiently guide the light.

The light source unit 160 may include a light source 161 and a light source substrate 163 on which the light source 161 is disposed.

The light source 161 may be positioned at an edge portion or an incident side surface of the light guide plate 150 (e.g., a side surface of the light guide plate 150 that is perpendicular to an upper surface of the light guide plate 150). As an example, the light source 161 may emit light to the edge portion or the incident side surface of the light guide plate 150. The light source 161 may include at least one LED chip and a package for accommodating the LED chip. For example, the LED chip may be a gallium nitride (GaN)-based LED chip emitting blue light.

The number of the light sources 161 may have various values in consideration of the size of the display panel 120 or luminance uniformity. The light source substrate 163 may be a printed circuit board (PCB) or a metal PCB.

The light source unit 160 may be formed on one side, opposite sides or all four sides of the light guide plate 150 in consideration of the size of the display panel 120 or luminance uniformity. An exemplary light source unit 160 according to an exemplary embodiment of the present invention facing a side of the light guide plate 150 will be described in more detail below; however, exemplary embodiments of the present invention are not limited thereto.

A wavelength conversion unit may be positioned between the light source unit 160 and the light guide plate 150. The wavelength conversion unit may include a material for converting the wavelength of light. For example, the wavelength conversion unit may convert a wavelength of a blue light emitted from the blue LED light source into white light.

The reflection sheet 170, having reflectance, may include, for example, polyethylene terephthalate (PET), and one surface thereof may be coated with a diffusion layer including, for example, titanium dioxide. In addition, the reflection sheet 170 may include a material that includes a metal such as silver (Ag).

The bottom chassis 180 may include a rigid metal such as stainless steel or a material having good heat dissipation properties such as aluminum or an aluminum alloy. The bottom chassis 180 maintains a framework of the display device and protects various components accommodated therein. The bottom chassis 180 may include at least one first insertion hole 181*h* and at least one second insertion hole 182*h*. The at least one first insertion hole 181*h* may be used to couple the bottom chassis 180 to the guide member 200, as discussed in more detail below. The at least one second insertion hole 182*h* may be used to couple the protection member 190 to the bottom chassis 180, as discussed in more detail below.

The protection member 190 may be positioned to completely overlap the driving circuit board 125 along a direction orthogonal to a bottom surface of the bottom chassis 180 facing away from the display panel 120. The protection member 190 may be positioned to partially overlap the flexible printed circuit board 127 along the direction orthogonal to the bottom surface of the bottom chassis 180 facing away from the display panel 120. The protection member 190 may be positioned below the bottom surface of the bottom chassis 180. The protection member 190 may include a rigid metal such as stainless steel or a material having good heat dissipation characteristics such as aluminum or an aluminum alloy. In addition, the protection member 190 may have substantially a same shape as a shape of the driving circuit board 125 and the flexible printed circuit board 127. Thus, the protection member may protect the driving circuit board 125 and the flexible printed circuit board 127.

An insulating member 195 may be disposed on a surface of the protection member 190 facing the driving circuit board 125. While the protection member 190 may be spaced apart from the driving circuit board 125, the insulating member 195 may prevent contact between the driving circuit board 125 and the protection member 190 in the event of, for example, a deformation of the protection film 190 toward the driving circuit board 125 as a result of a physical impact with the protection film 190.

The protection member 190 may include a projection 197 protruding toward the bottom chassis 180. The projection 197, along with the guide member 200, may fasten the protection member 190 to the bottom chassis 180.

Figure 4A:
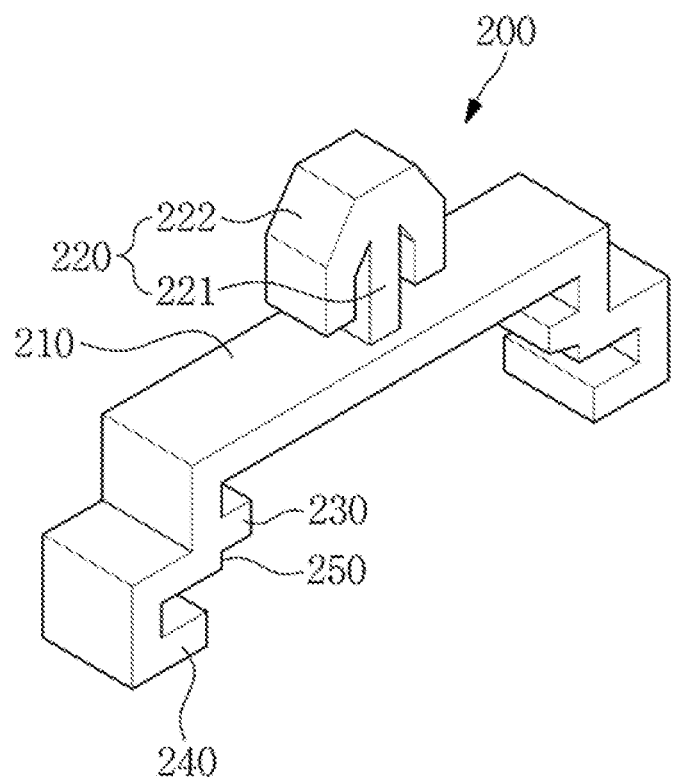
FIG. 4A is a perspective view illustrating a guide member according to an exemplary embodiment of the present invention.
Figure 4B:
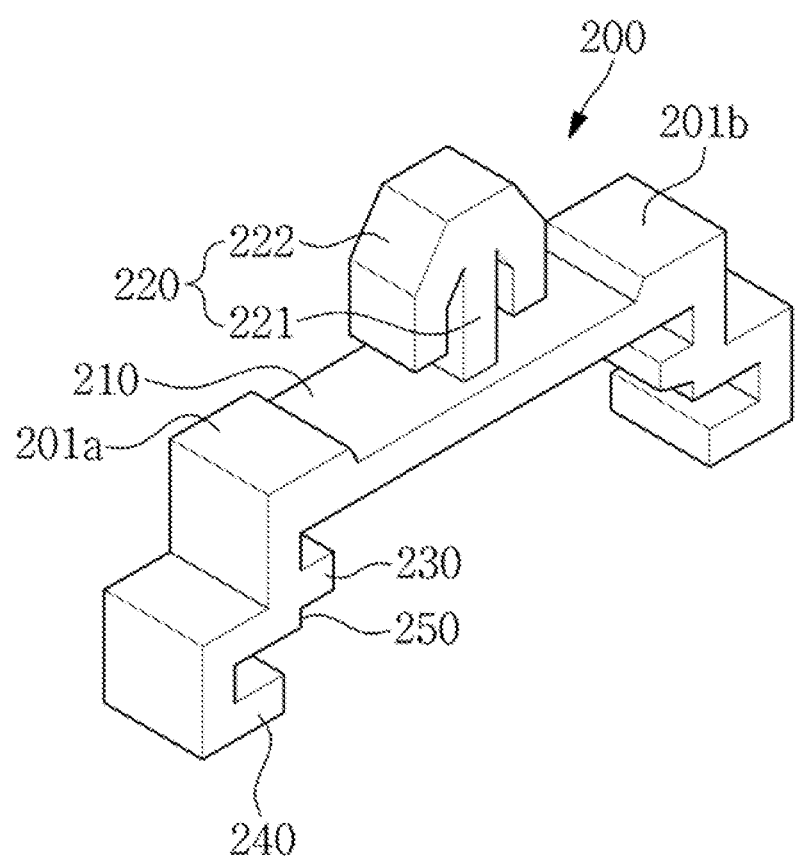
FIG. 4B is a perspective view illustrating a guide member according to an exemplary embodiment of the present invention.
Figure 5:
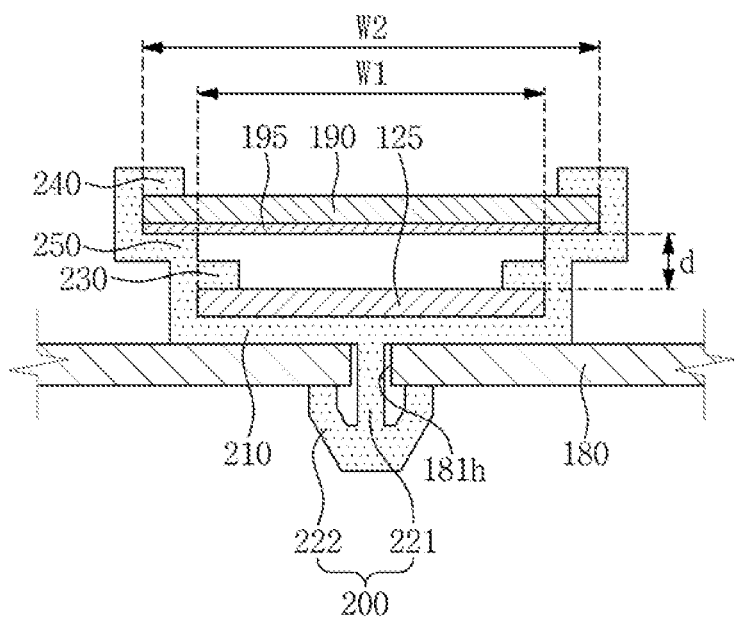
FIG. 5 is a cross-sectional view illustrating the guide member according to an exemplary embodiment of the present invention.

FIG. 4A is a perspective view illustrating a guide member according to an exemplary embodiment of the present invention. FIG. 4B is a perspective view illustrating a guide member according to an exemplary embodiment of the present invention. FIG. 5 is a cross-sectional view illustrating the guide member according to an exemplary embodiment of the present invention.

Referring to FIGS. 3, 4A and 5, the guide member 200 may include a support portion 210, a coupling portion 220 extending from the support portion 210 and fastening the support portion 210 to the bottom chassis 180, a first fastening portion 230 extending from the support portion 210 and fastening the driving circuit board 125 to the guide member 200, a second fastening portion 240 extending from the first fastening portion 230 and fastening the protection member 190 to the guide member 200, and a gap maintaining portion 250 between the first fastening portion 230 and the second fastening portion 240.

As shown in FIG. 4B, the guide member 200 may further include first and second protrusions 210*a* and 210*b* protruding from the support portion 210. The first protrusion 210*a* protrudes from the one side of the support portion 210, and the second protrusion 210*b* protrudes from the other side of the support portion 210*b*. The first protrusion is unitary with the support portion 210, and the second protrusion 210*b* is unitary with the support portion 210.

The guide member 200 may include an acrylic resin such as PMMA (PolyMethylMethAcrylate) or a plastic material such as polycarbonate (PC). For example, the guide member 200 may include at least one selected from polycarbonate (PC), a transparent acrylic resin, polystyrene (PS), polymethyl methacrylate (PMMA), or polyethylene terephthalate (PET). The guide member 200 may be integrally formed through injection molding.

The coupling portion 220 according to an exemplary embodiment of the present invention may be coupled to a back surface of the bottom chassis 180 using a hook and/or a screw. The coupling portion 220 according to an exemplary embodiment of the present invention may be hook-coupled.

The coupling portion 220 according to an exemplary embodiment of the present invention may include an insert body 221 protruding in a vertical direction from a surface of the support portion 210 and a latch 222 extending from the insert body 221. The insert body 221 and the latch 222 may be inserted into and may project through the insertion hole 181*h* of the bottom chassis 180. The latch 222 may be inserted into the insertion hole 181*h* and then caught inside the bottom chassis 180 so that the support portion 210 is not detached therefrom.

The first fastening portion 230 according to an exemplary embodiment of the present invention may fasten the driving circuit board 125 to the guide member 200. For example, a space defined by the first fastening portion 230 may have substantially a same width W1 as a width of the driving circuit board 125. However, exemplary embodiments of the present invention are not limited thereto, and the first fastening portion 230 may have various widths according to the shape of the driving circuit board 125.

The second fastening portion 240 according to an exemplary embodiment of the present invention may fasten the protection member 190 to the guide member 200. For example, the second fastening portion 240 may form a space having substantially same width W2 as a width of the protection member 190. However, exemplary embodiments of the present invention are not limited thereto, and the second fastening portion 240 may have various widths depending on the shape of the protection member 190.

According to an exemplary embodiment of the present invention, the width W1 of the first fastening portion 230 may be less than the width W2 of the second fastening portion 240, but exemplary embodiments of the present invention are not limited thereto. According to an exemplary embodiment of the present invention, the width W1 of the first fastening portion 230 and the width W2 of the second fastening portion 240 may be substantially equal to each other. According to an exemplary embodiment of the present invention, the width W1 of the first fastening portion 230 may be greater than the width W2 of the second fastening portion 240.

According to an exemplary embodiment of the present invention, the first fastening portion 230 and the second fastening portion 240 may each form a step shape.

The guide member 200 may further include the gap maintaining portion 250 for maintaining a constant gap between the driving circuit board 125 and the protection member 190 between the first fastening portion 230 and the second fastening portion 240.

The gap maintaining portion 250 may have a thickness appropriate to maintain a gap (see, e.g., a gap "d" illustrated in FIG. 5) between a bottom surface of the driving circuit board 125 facing away from the bottom chassis 180 and an upper surface of the protection member 190 of from about 3 mm to about 7 mm. The gap maintaining portion 250 may have a thickness appropriate to maintain a gap (see, e.g., a gap "d" illustrated in FIG. 5) between a bottom surface of the driving circuit board 125 facing away from the bottom chassis 180 and an upper surface of the insulating member 195 disposed on the protection member 190 of from about 3 mm to about 7 mm. However, exemplary embodiments of the present invention are not limited thereto, and the gap maintaining portion 250 may be omitted.

According to an exemplary embodiment of the present invention, a display device may include the bottom chassis 180 and the display panel 120 positioned in the bottom chassis 180. The guide member 200 may be coupled to the bottom chassis 180. The guide member 200 may include the coupling portion 220 projecting through a hole (e.g., the first insertion hole 181h) formed in the bottom chassis 180. The support portion 210 may be in direct contact with a bottom surface of the bottom chassis 180 facing away from the display panel 120. The driving circuit board 125 may be in direct contact with a surface of the support portion facing 210 away from the bottom surface of the bottom chassis 180. The gap maintaining portion 250 may have a width wider than a width of the support portion 210. The protection member 190 may be disposed on the gap maintaining portion 250. The gap maintaining portion 250 may be positioned and dimensioned to separate the protection member 190 from the driving circuit board 125 along a direction orthogonal to the bottom surface of the bottom chassis 180.

Figure 6:
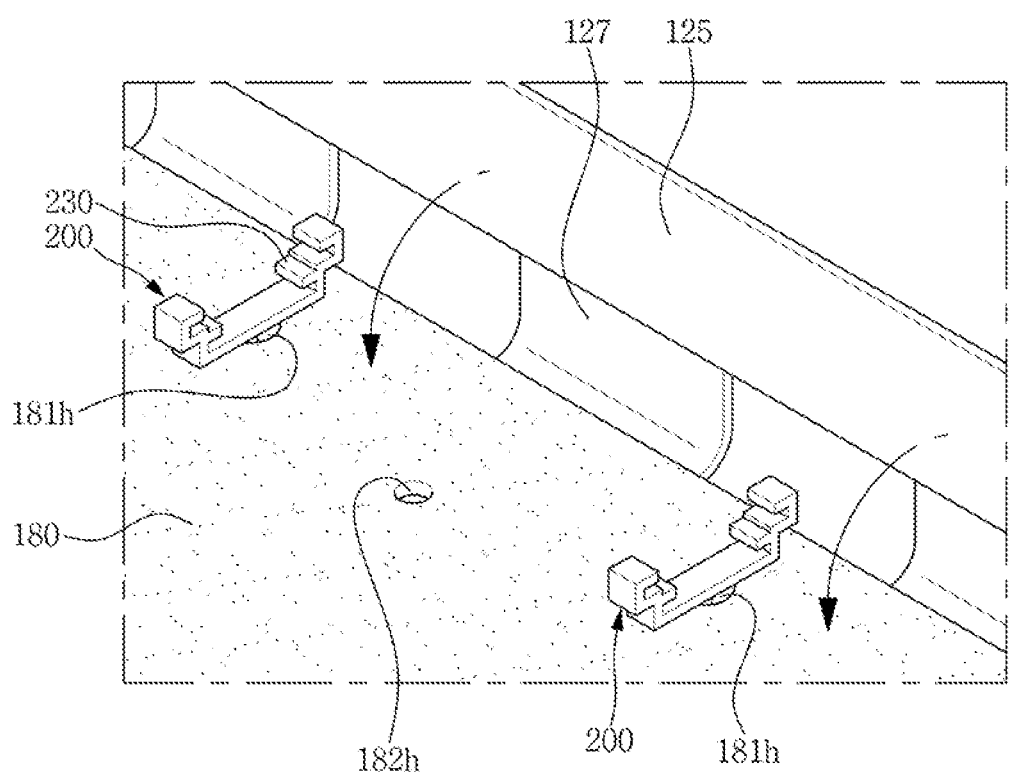
FIG. 6 is a rear view illustrating the guide member coupled to a bottom chassis according to an exemplary embodiment of the present invention.
Figure 7:
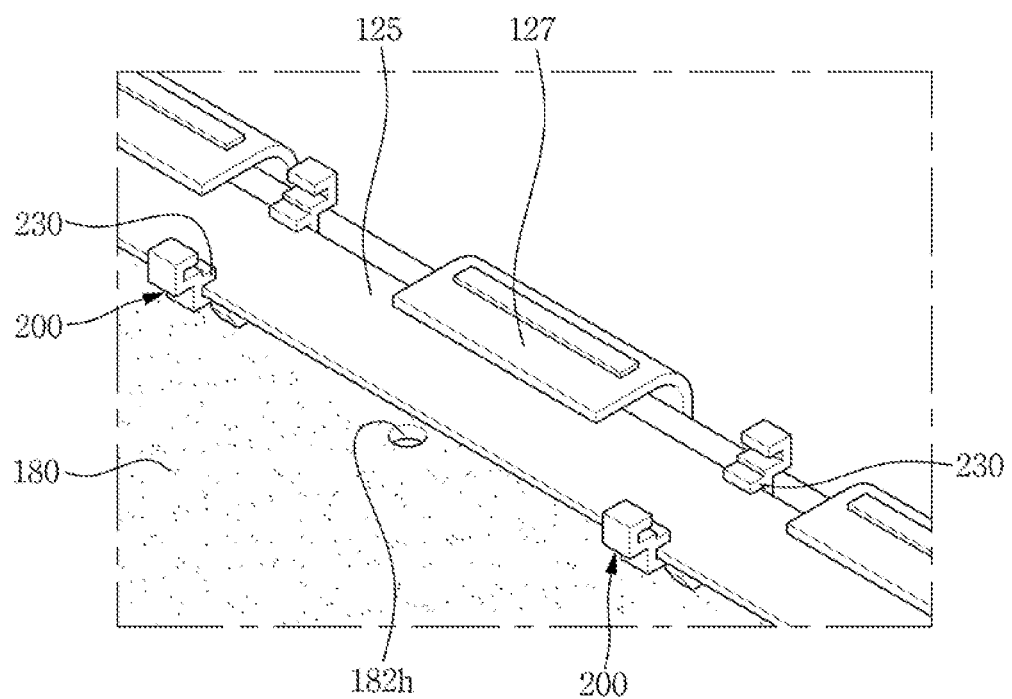
FIG. 7 is a rear view illustrating a driving circuit board fastened to the guide member according to an exemplary embodiment of the present invention.
Figure 8:
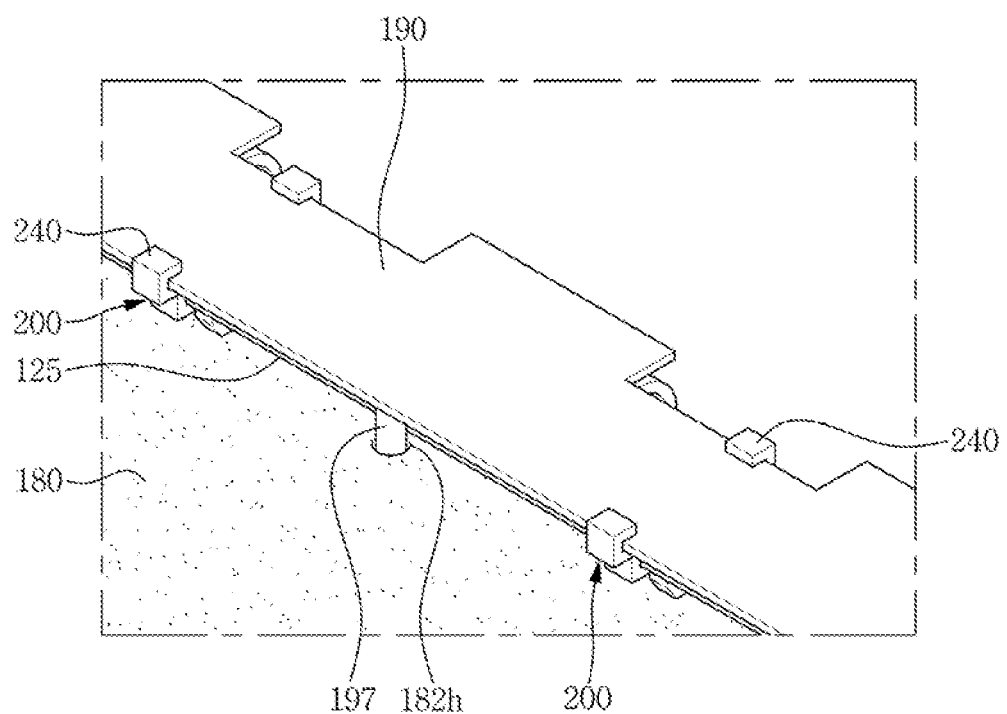
FIG. 8 is a rear view illustrating a protection member fastened to the guide member according to an exemplary embodiment of the present invention.

FIG. 6 is a rear view illustrating the guide member coupled to a bottom chassis according to an exemplary embodiment of the present invention. FIG. 7 is a rear view illustrating a driving circuit board fastened to the guide member according to an exemplary embodiment of the present invention. FIG. 8 is a rear view illustrating a protection member fastened to the guide member according to an exemplary embodiment of the present invention.

Referring to FIG. 6, the guide member 200 may be coupled to the bottom chassis 180 using the first insertion hole 181h formed in the back surface of the bottom chassis 180. The guide member 200 may be coupled thereto using a hook or a screw. The guide member 200 may be fastened to the back surface of the bottom chassis 180 in close contact therewith. As an example, the guide member 200 may be in direct contact with the back surface of the bottom chassis 180.

Referring to FIG. 7, the driving circuit board 125 and the flexible printed circuit board 127 on one side of the display panel are bent to be positioned below the back surface of the bottom chassis 180, and the driving circuit board 125 may be coupled to the first fastening portion 230 of the guide member 200. The driving circuit board 125 may be held in position by the first fastening portion 230, which may include a portion in direct contact with a surface of the driving circuit board 125 facing away from the back surface of the bottom chassis 180.

Referring to FIG. 8, the protection member 190 may be coupled to the second fastening portion 240 of the guide member 200. The protection member 190 may be held in position by the second fastening portion 240, which may include a portion in direct contact with a surface of the protection member 190 facing away from the back surface of the bottom chassis 180. The projection 197 of the protection member 190 may project through the second insertion hole 182h formed in the back surface of the bottom chassis 180.

Thus, the protection member 190 may be at least partially fastened in position by the guide member 200, and may at least partially be fastened in position by the projection 197 inserted in the second insertion hole 182h formed in the bottom chassis 180.

Figure 9:
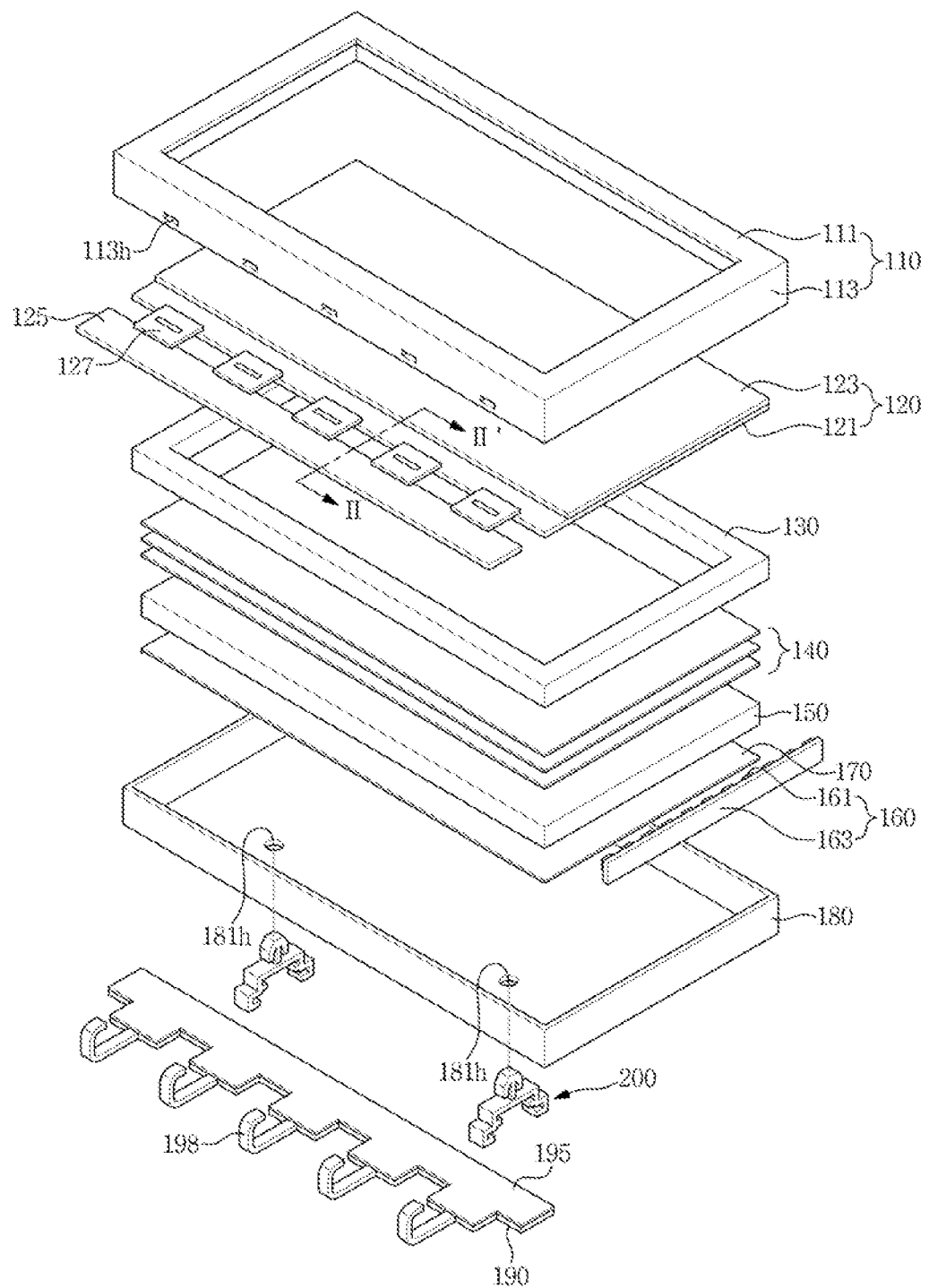
FIG. 9 is an exploded perspective view illustrating a display device according to an exemplary embodiment of the present invention.
Figure 10:
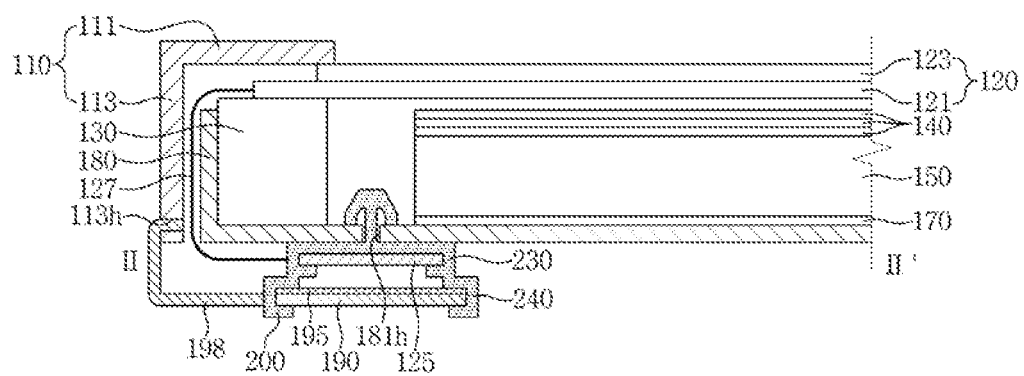
FIG. 10 is a cross-sectional view taken along line I-II' of FIG. 9.

FIG. 9 is an exploded perspective view illustrating a display device according to an exemplary embodiment of the present invention. FIG. 10 is a cross-sectional view taken along line II-II' of FIG. 9. Detailed descriptions of components and elements of the display device according to an exemplary embodiment of the present invention described with reference to FIGS. 9 and 10 that are the same as those described above may be omitted below.

Referring to FIGS. 9 and 10, the display device according to an exemplary embodiment of the present invention may include the top chassis 110, the display panel 120, the mold frame 130, the optical sheet 140, the light guide plate 150, the light source unit 160, the reflection sheet 170, the bottom chassis 180, and the protection member 190. In addition, the display device according to an exemplary embodiment of the present invention may include the guide member 200 coupled to the bottom chassis 180 and fastening the driving circuit board 125 and the protection member 190.

The mold frame 130, the optical sheet 140, the light guide plate 150, the light source unit 160, the reflection sheet 170 and the bottom chassis 180 may be collectively referred to as a backlight unit.

The top chassis 110 may include the flat surface portion 111 that covers the edge of the display panel 120 and the side surface portion 113 that is bent at the flat surface portion 111 and covers the side surface of the display panel 120. The side surface portion 113 of the top chassis 110 may be coupled with the mold frame 130 or the bottom chassis 180 through hook coupling and/or screw coupling.

The bottom chassis 180 may maintain a framework of the display device and may protect various components accommodated therein. The bottom chassis 180 may have at least one first insertion hole 181h, which may be used to couple the guide member 200 to the bottom chassis 180.

The protection member 190 may be positioned to cover the driving circuit board 125, and the flexible printed circuit board 127 on a back surface of the bottom chassis 180.

The insulating member 195 may be disposed on a surface of the protection member 190 facing the driving circuit board 125. The insulating member 195 may prevent contact of the driving circuit board 125 and the protection member 190.

The protection member 190 may further include a hook 198 coupled to the side surface portion 113 of the top chassis 110. The hook 198 may fasten the protection member 190 to the top chassis 110.

The driving circuit board 125 and the flexible printed circuit board 127 on a side of the display panel 120 are bent to be located on the back surface of the bottom chassis 180, and the driving circuit board 125 may be coupled to the first fastening portion 230 of the guide member 200 in an insertion manner.

The protection member 190 may be coupled to the second fastening portion 240 of the guide member 200 in an insertion manner. The hook 198 of the protection member 190 may be inserted into a fastening hole 113h defined in the side surface portion 113 of the top chassis 110.

Thus, the protection member 190 may be at least partially fastened in position by the guide member 200, and the protection member 190 may be at least partially fastened in position by the top chassis 110.

As set forth herein, the driving circuit board and the protection member may be fastened in position by using the guide member such that the gap between the driving circuit board and the protection member may be kept constant.

In an exemplary embodiment of the present invention, since the display device fastens the driving circuit board and the protection member by using the guide member, a separate configuration for fastening the protection member may be omitted. Thus, the material costs may be reduced, the assembly may become relatively easy, and defects that may occur during the assembly process may be reduced or eliminated.

Further, in an exemplary embodiment of the present invention, since the display device fastens the driving circuit board and the protection member by using the guide member, a screw or the like for fastening the protection member may be omitted, such that a rattle noise may be reduced or eliminated.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
   a display panel;
   a bottom chassis dimensioned and positioned to support to the display panel;
   a driving circuit board positioned below a back surface of the bottom chassis facing away from the display panel;
   a protection member positioned below the driving circuit board; and
   a guide member coupled to the bottom chassis and fastening the driving circuit board and the protection member to each other.

2. The display device as claimed in claim 1, wherein the guide member comprises:
   a support portion;
   a coupling portion extending from a surface of the support portion facing the bottom chassis through the back surface of the bottom chassis opposite the display panel and fastening the support portion to the bottom chassis;
   a first fastening portion extending from the support portion and fastening the driving circuit board to the guide member; and
   a second fastening portion extending from the first fastening portion and fastening the protection member to the guide member.

3. The display device as claimed in claim 2, wherein the guide member further comprises a gap maintaining portion positioned between the first fastening portion and the second fastening portion.

4. The display device as claimed in claim 2, wherein the coupling portion comprises at least one latch disposed on an inner surface of the bottom chassis facing the display panel.

5. The display device as claimed in claim 2, wherein the coupling portion comprises:
   an insert body projecting through the back surface of the bottom chassis opposite the display panel; and
   a latch extending from the insert body, wherein the latch is disposed on an inner surface of the bottom chassis facing the display panel.

6. The display device as claimed in claim 5, wherein the bottom chassis has a first insertion hole, and wherein the coupling portion projects through the first insertion hole.

7. The display device as claimed in claim 2, wherein the first fastening portion has a narrower width than a width of the second fastening portion.

8. The display device as claimed in claim 2, wherein the first fastening portion has substantially a same width as a width of the second fastening portion.

9. The display device as claimed in claim 2, wherein the first fastening portion has a wider width than a width of the second fastening portion.

10. The display device as claimed in claim 3, wherein a distance between the driving circuit board and the protection member is in a range of from about 3 mm to about 7 mm.

11. The display device as claimed in claim 1, further comprising an insulating member disposed on a surface of the protection member facing the driving circuit board.

12. The display device as claimed in claim 1, further comprising at least one flexible printed circuit board connecting the display panel and the driving circuit board.

13. The display device as claimed in claim 12, wherein the protection member has, substantially a same shape as a shape of the driving circuit board and the flexible printed circuit board.

14. The display device as claimed in claim 1, wherein the protection member further comprises a projection protruding toward the bottom chassis.

15. The display device as claimed in claim 14, wherein the bottom chassis has a second insertion hole, and wherein the projection projects through the second insertion hole.

16. The display device as claimed in claim 1, further comprising a top chassis covering an edge portion and a side surface of the display panel.

17. The display device as claimed in claim 9, wherein the protection member further comprises a hook coupled to a top chassis.

18. The display device as claimed in claim 17, wherein the top chassis has a fastening hole, and wherein the hook is disposed in the fastening hole.

19. The display device as claimed in claim 1, wherein the guide member is integrally formed through injection molding.

20. The display device as claimed in claim 1, wherein the guide member comprises at least one selected from polycarbonate (PC), a transparent acrylic resin, polystyrene (PS), polymethyl methacrylate (PMMA), or polyethylene terephthalate (PET).

21. A display device comprising:
   a bottom chassis;

a display panel positioned in the bottom chassis; and
a guide member coupled to the bottom chassis,
wherein the guide member comprises:
- a coupling portion projecting through a hole of the bottom chassis;
- a support portion in direct contact with a bottom surface of the bottom chassis facing away from the display panel, wherein a driving circuit board is in direct contact with a surface of the support portion facing away from the bottom surface of the bottom chassis;
- a gap maintaining portion having a width wider than a width of the support portion, wherein a protection member is disposed on the gap maintaining portion, and wherein the gap maintaining portion is positioned and dimensioned to separate the protection member from the driving circuit board along a direction orthogonal to the bottom surface of the bottom chassis.

22. The display device of claim 21, wherein a width of the protection member is wider than a width of the driving circuit board.

23. The display device of claim 22, further comprising an insulating member disposed on a surface of the protection member facing the driving circuit board, wherein the insulating member is spaced apart from the driving circuit board along the direction orthogonal to the bottom surface of the bottom chassis.

\* \* \* \* \*